United States Patent
Hong (10) Patent No.: US 9,738,508 B2
(45) Date of Patent: Aug. 22, 2017

(54) MEMS CAPACITIVE PRESSURE SENSORS

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/930,926

(22) Filed: Nov. 3, 2015

(65) Prior Publication Data
US 2016/0152465 A1 Jun. 2, 2016

Related U.S. Application Data

(62) Division of application No. 14/095,060, filed on Dec. 3, 2013, now Pat. No. 9,206,030.

(30) Foreign Application Priority Data

Jul. 3, 2013 (CN) .......................... 2013 1 0277659

(51) Int. Cl.
*H01L 41/113* (2006.01)
*B81B 3/00* (2006.01)
(Continued)

(52) U.S. Cl.
CPC .......... *B81B 3/0059* (2013.01); *B81B 3/0021* (2013.01); *B81C 1/00166* (2013.01);
(Continued)

(58) Field of Classification Search
CPC ................ B81B 3/0059; B81B 3/0021; B81B 2201/0021; B81B 2201/0257; B81B 2201/0264; B81B 2203/0315; B81B 2203/00; B81B 2203/01; B81C 1/00182; B81C 1/00134; B81C 1/00166;
(Continued)

(56) References Cited

U.S. PATENT DOCUMENTS 5,573,679 A 11/1996 Mitchell et al.
2003/0019299 A1* 1/2003 Horie .................... G01L 9/0073
73/718

(Continued)

*Primary Examiner* — Galina Yushina
(74) *Attorney, Agent, or Firm* — Anova Law Group, PLLC (57) ABSTRACT

A MEMS capacitive pressure sensor is provided. The MEMS capacitive pressure sensor includes a substrate having a first region and a second region, and a first dielectric layer formed on the substrate. The capacitive pressure sensor also includes a second dielectric layer having a step surface profile formed on the first dielectric layer, and a first electrode layer having a step surface profile formed on the second dielectric layer. Further, the MEMS capacitive pressure sensor includes an insulation layer formed on the first electrode layer, and a second electrode layer having a step surface profile with a portion formed on the insulation layer in the peripheral region and the rest suspended over the first electrode layer in the device region. Further, the MEMS capacitive pressure sensor also includes a chamber having a step surface profile formed between the first electrode layer and the second electrode layer.

12 Claims, 7 Drawing Sheets

(51) Int. Cl.
*B81C 1/00* (2006.01)
*G01L 9/00* (2006.01)

(52) U.S. Cl.
CPC ...... *B81C 1/00182* (2013.01); *B81C 1/00373* (2013.01); *B81C 1/00523* (2013.01); *G01L 9/00* (2013.01); *G01L 9/0045* (2013.01); *G01L 9/0047* (2013.01); *G01L 9/0073* (2013.01); *H01L 41/113* (2013.01); *B81B 2201/0264* (2013.01); *B81B 2203/0109* (2013.01); *B81B 2203/0315* (2013.01); *B81B 2203/0392* (2013.01); *B81B 2203/04* (2013.01); *B81C 1/00023* (2013.01); *B81C 1/00134* (2013.01)

(58) Field of Classification Search
CPC ..... B81C 1/00523; G01L 1/00; G01L 9/0072; G01L 9/0045; G01L 9/0047; G01L 9/0073; H01L 41/113; H01L 41/1132; H01L 41/1136; H01L 2924/1461
See application file for complete search history.

(56) References Cited

U.S. PATENT DOCUMENTS

| | | | |
|---|---|---|---|
| 2003/0137021 A1 | 7/2003 | Wong et al. | |
| 2009/0146227 A1* | 6/2009 | Igarashi | B81B 7/02 257/415 |
| 2010/0155864 A1 | 6/2010 | Laming et al. | |
| 2011/0271764 A1* | 11/2011 | Lee | G01L 19/0092 73/718 |
| 2013/0161702 A1* | 6/2013 | Chen | B81C 1/00246 257/254 |

* cited by examiner

FIG. 1

(Prior art)

MEMS CAPACITIVE PRESSURE SENSORS

CROSS-REFERENCES TO RELATED APPLICATIONS

This application is a divisional of U.S. patent application Ser. No. 14/095,060, filed on Dec. 3, 2013, which claims the priority of Chinese patent application No. 201310277659.7, filed on Jul. 3, 2013, the entirety of all of which is incorporated herein by reference.

FIELD OF THE INVENTION

The present invention generally relates to the field of semiconductor manufacturing technology and, more particularly, relates to pressure sensors and fabrication techniques thereof.

BACKGROUND

Micro-electro mechanical system (MEMS) is an integrated device which can obtain information; perform information processing; and execute operations. A MEMS sensor can detect various external information including pressure, position, velocity, acceleration, magnetic field, temperature or humidity, etc; and convert these external information into electrical signals. Thus, these external information can be processed by the MEMS. A pressure sensor is a type of device, which can convert pressure signals into electric signals; and a MEMS capacitive sensor is a typical type of pressure sensors.

Figure 1:
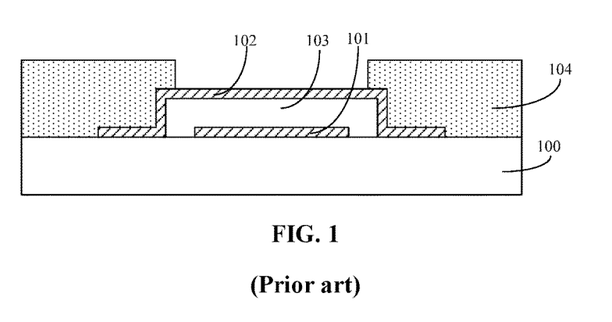
FIG. 1 illustrates an existing MEMS capacitive pressure sensor.

FIG. 1 illustrates an existing MEMS capacitive pressure sensor. As shown in FIG. 1, the MEMS capacitive pressure sensor includes a substrate 100. The substrate 100 may include a semiconductor substrate (not shown), a plurality of semiconductor devices (not shown), such as CMOS devices, etc., on the semiconductor substrate, electrical interconnection structures electrically connecting the semiconductor devices, and a dielectric layer isolating the semiconductor devices and the interconnection structures. The MEMS capacitive pressure sensor also includes a first electrode layer 101 on the substrate 100. The first electrode layer 101 is electrically connected with the semiconductor devices in the substrate 100 through the electrical interconnection structures. Further, the MEMS capacitive pressure sensor includes a second electrode layer 102 on the substrate 100; and a chamber 103 is formed between the first electrode layer 101 and the second electrode layer 102. The chamber 103 electrically isolates the first electrode layer 101 and the second electrode layer 102. Further, the MEMS capacitive pressure sensor also includes a dielectric layer 104 on a surface of the second electrode layer 103 and a surface of the substrate 100. A portion of the second electrode layer 102 is exposed by the dielectric layer 104.

The first electrode layer 101, the second electrode layer 102 and the chamber 103 form a capacitive structure. When a pressure is applied on the second electrode layer 102, the second electrode layer 102 is deformed; and the distance between the first electrode layer 101 and the second electrode layer 102 changes. Thus, the capacitance of the capacitive structure changes. Because the pressure on the second electrode layer 102 is corresponding to the capacitance of the capacitive structure, the pressure on the second electrode layer 102 can be converted into an output signal of the capacitive structure.

However, the sensibility of the capacitive structure may have a certain limitation, and may be unable to match requirements of continuous technology developments. The disclosed device structures, methods and systems are directed to solve one or more problems set forth above and other problems.

BRIEF SUMMARY OF THE DISCLOSURE

One aspect of the present disclosure includes a MEMS capacitive pressure sensor. The MEMS capacitive pressure sensor includes a substrate having a first region and a second region, and a first dielectric layer formed on the substrate. The MEMS capacitive pressure sensor also includes a second dielectric layer having a step surface profile formed on the first dielectric layer, and a first electrode layer having a step surface profile formed on the second dielectric layer. Further, the MEMS capacitive pressure sensor includes an insulation layer formed on the first electrode layer and a second electrode layer having a step surface profile with a portion formed on the second dielectric layer in the second region and the rest suspended over the first electrode layer in the first region. Further, the MEMS capacitive pressure sensor includes a chamber having a step surface profile formed between the first electrode layer and the second electrode layer.

Another aspect of the present disclosure includes a method for fabricating a MEMS capacitive pressure sensor. The method includes providing a substrate having a first region and a second region. The method also includes forming a first dielectric layer on the substrate; and forming a second dielectric layer having a step surface profile on the first dielectric layer. The method also includes forming a first electrode layer on the second dielectric layer; and forming an insulation layer on the first electrode layer. Further, the method includes forming a sacrificial layer on the first electrode layer; and forming a second electrode layer on the sacrificial layer. Further, the method also includes removing the sacrificial layer to form a chamber having a step profile between the first electrode layer and the second electrode layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Referring to FIG. 1, when the MEMS capacitive pressure sensor converts the pressure applied on the second electrode layer 102 into an electrical output signal of the capacitive structure, the capacitance of the capacitive structure is reversely proportional to the distance of the first electrode layer 101 and the second electrode layer 102; and proportional to an overlap area of the first electrode layer 101 and the second electrode layer 102.

However, the size of such a MEMS capacitive pressure sensor may be limited by a chip size and/or sizes of semiconductor devices, the overlap area between the first electrode layer 101 and the second electrode layer 102 may also be limited, which may cause the capacitance between the first electrode layer 101 and the second electrode layer 102 to be relatively small. When the applied pressure is substantially small, a corresponding capacitance change between the first electrode layer 101 and the second electrode layer 102 may also be substantially small, thus it may be difficult to obtain the corresponding capacitance. Therefore, the sensibility of such a MEMS capacitive pressure sensor may be relatively low. MEMS structures using electrode layers with step surface profiles are disclosed to overcome these issues.

Figure 13:
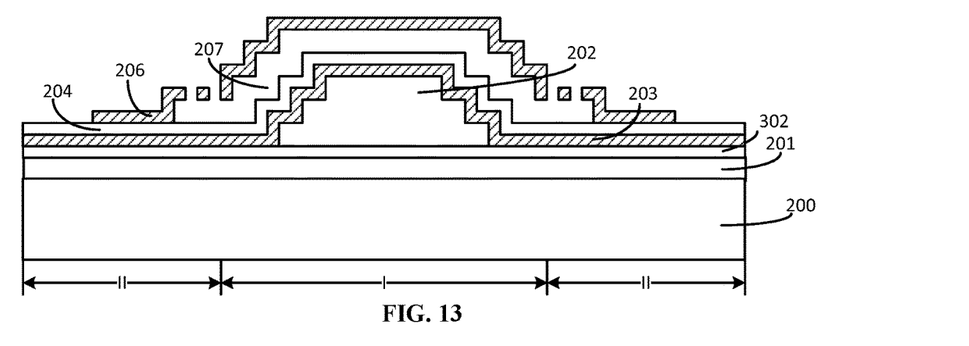
Figure 14A:
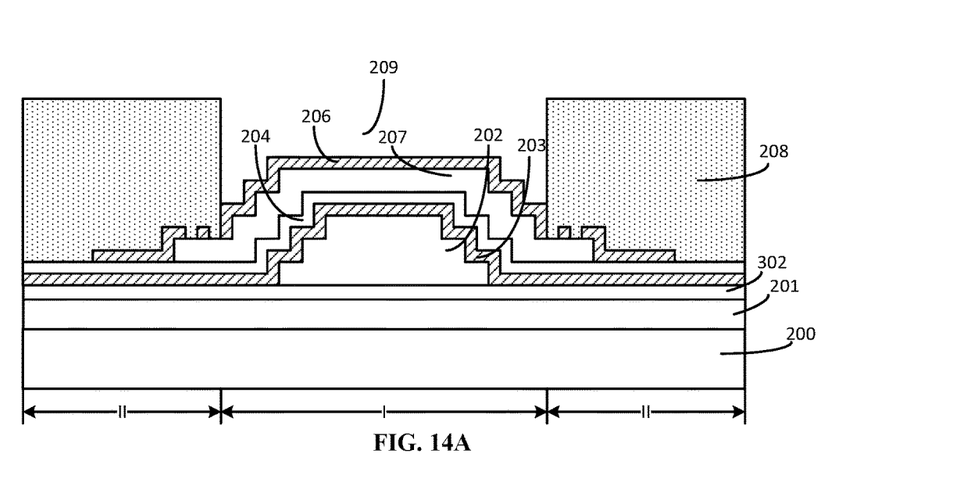
Figure 14B:
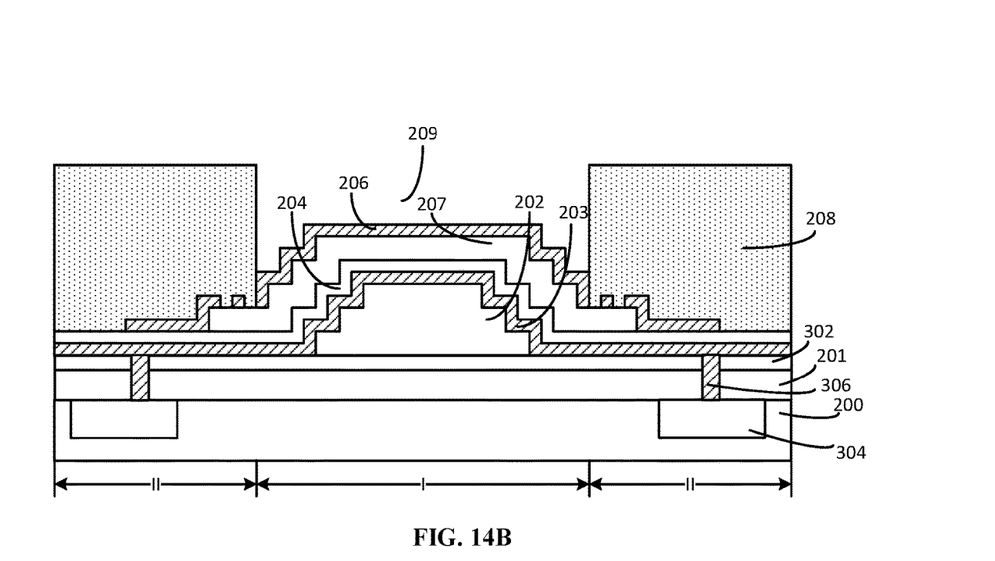
Figure 14C:
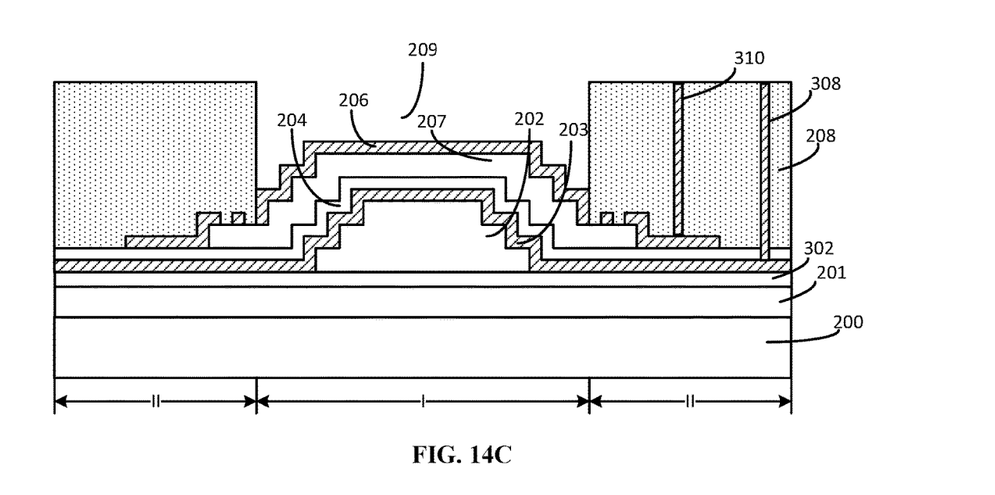
Figure 15:
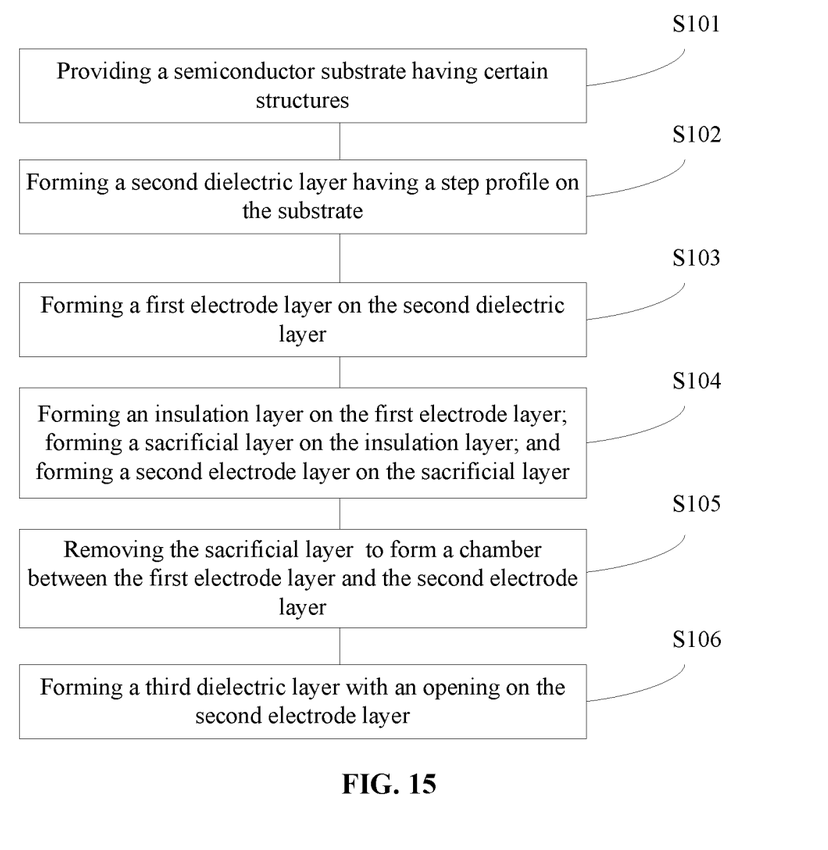
FIG. 15 illustrates an exemplary fabrication process of a MEMS capacitive pressure sensor consistent with the disclosed embodiments.

FIG. 15 illustrates an exemplary fabrication process of a MEMS capacitive pressure sensor and FIGS. 2-14 illustrate exemplary semiconductor structures corresponding to various stages of the fabrication process.

Figure 2:
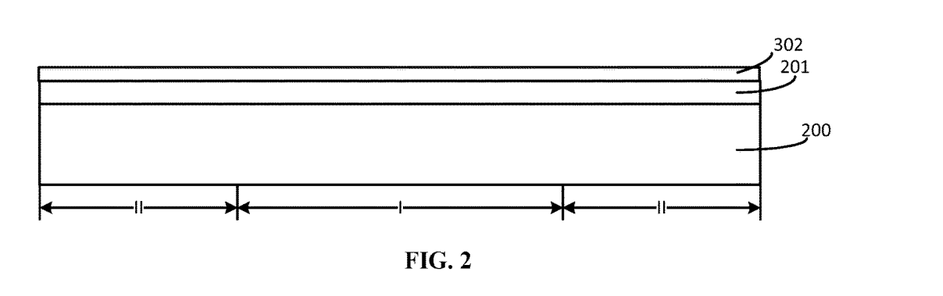
FIGS. 2-13 and 14A-14C illustrate semiconductor structures corresponding to certain stages of an exemplary fabrication process of a MEMS capacitive pressure sensor consistent with the disclosed embodiments.

As shown in FIG. 15, at the beginning of the fabrication process, a substrate with certain structures is provided (S101). FIG. 2 illustrates a corresponding semiconductor structure.

As shown in FIG. 2, a substrate 200 is provided. The substrate 200 may have a first region I and a second region II. The second region II may surround the first region I. In one embodiment, the first region I may be a device region; and the second region may be a peripheral region. For illustrative purposes, a device region I may be referred to the first region I; and a peripheral region II may be referred to the second region II.

The substrate 200 may include a semiconductor substrate (not shown) and a plurality of the semiconductor devices (not shown) formed in the semiconductor substrate, and/or on one surface of the semiconductor substrate. The semiconductor devices may be CMOS devices including transistors, memories, capacitors or resistors. Other devices may also be included.

The substrate 200 may also include electrical interconnection structures (not shown) and a dielectric layer (not shown) isolating the semiconductor devices. Some devices/structures may be added in the substrate 200; and some devices/structures may be omitted.

The semiconductor substrate may include any appropriate semiconductor materials, such as silicon, silicon on insulator (SOI), silicon germanium, carborundum, indium antimonide, lead telluride, indium arsenide, indium phosphide, gallium arsenidie, gallium antimonite, ally semiconductor or a combination thereof. The semiconductor substrate may also be germanium on insulator (GOI), or glass substrate, etc.

In certain other embodiments, the substrate 200 may only be the semiconductor substrate without any semiconductor devices. The semiconductor substrate may include silicon, silicon on insulator (SOI), germanium on insulator (GOI), silicon germanium, carborundum, indium antimonite, lead telluride, indium arsenide, indium phosphide, gallium arsenidie, gallium antimonite or alloy semiconductor, etc.

The dielectric layer may be made of any appropriate material, such as one or more of silicon oxide, silicon nitride and silicon oxynitride, etc.

In one embodiment, the semiconductor devices are CMOS transistors; and the substrate is silicon. The device region I may be used to subsequently form a MEMS capacitive pressure sensor.

Further, as shown in FIG. 2, a first dielectric layer 201 may be formed on one surface of the substrate 200. The surface of the substrate 200 may be surfaces of the dielectric layer for isolating the semiconductor devices and the electrical interconnection structures. Thus, the first dielectric layer 201 is formed on the surfaces of the dielectric layer for isolating the semiconductor devices and the electrical interconnection structures. The first dielectric layer 201 may be used to isolate a subsequently formed first electrode layer from the substrate 200.

In one embodiment, conductive vias may be formed in the first dielectric layer 201, and/or in the substrate 200. The conductive vias may be utilized to electrically connect a subsequently formed first electrode layer with the semiconductor devices and interconnection structures in, and/or on the substrate 200.

In certain other embodiments, when the substrate 200 is only a semiconductor substrate without any devices and structures, the first dielectric layer 201 may be directly formed on the semiconductor substrate. The conductive vias may unnecessarily be formed.

The first dielectric layer 201 may be made of any appropriate material, such as silicon oxide, silicon nitride or silicon oxynitride, etc. A thickness of the first dielectric layer may be in a range of approximately 100 Å~1000 Å. Various processes may be used to form the first dielectric layer 201, such as a chemical vapor deposition (CVD) process, a physical vapor deposition (PVD) process, an atomic layer deposition (ALD) process, a selective epitaxial process or a flowable chemical vapor deposition (FCVD) process, etc. In one embodiment, the first dielectric layer 201 is formed by a CVD process.

The first dielectric layer 201 may be used to isolate a subsequently formed first electrode layer from the substrate 200. The first dielectric layer 201 may also be used as an etching stop layer to protect the surface of the substrate 200 when subsequent etching processes are performed.

Optionally and additionally, an etching stop layer 302 may be formed on the first dielectric layer 201. The etching stop layer 302 may be used as an etching stop layer of subsequent etching process to protect the substrate 200. The etching stop layer 302 may be made of SiN, SiCN, etc.

Figure 3:
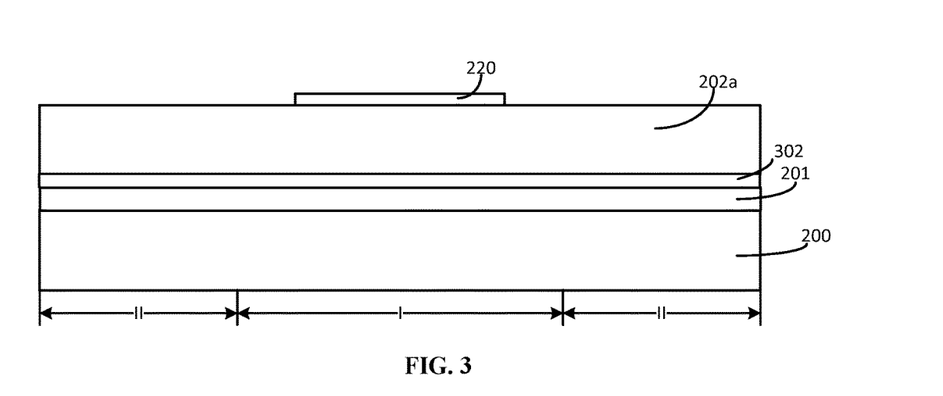

Returning to FIG. 15, after forming the first dielectric layer 201, a second dielectric thin film 202a may formed on the first dielectric layer 201 (S102). FIG. 3 illustrates a corresponding semiconductor structure.

As shown in FIG. 3, a second dielectric thin film 202a is formed on the first dielectric layer 201. After forming the second dielectric thin film 202a (may be referred as a first insulator), a photoresist layer 220 may also be formed on the second dielectric thin film 202a. The photoresist layer 220 may be used to define a first surface pattern of a subsequently formed second dielectric layer.

Figure 4:
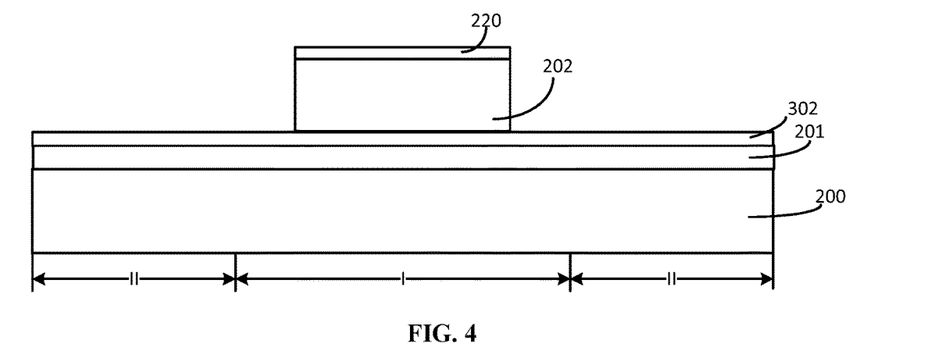

Further, as shown in FIG. 4, after forming the photoresist layer 220, a second dielectric layer 202 may be formed by the etching second dielectric thin film 202a until a surface of the first dielectric layer 201 is exposed.

Figure 5:
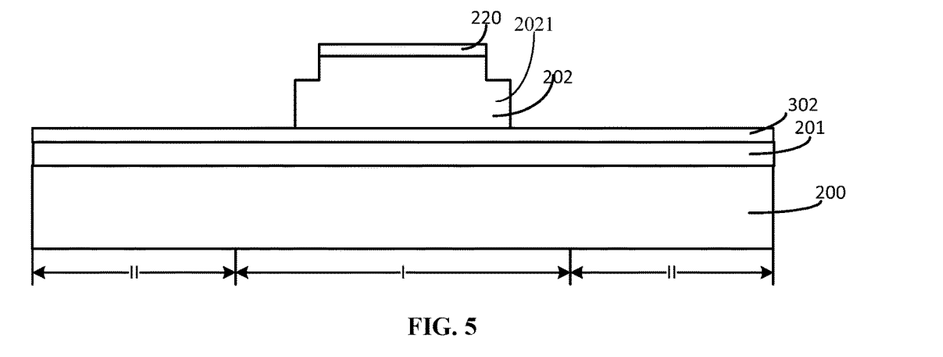

Further, as shown in FIG. 5, a portion of the second dielectric layer 202 may be etched using the photoresist layer 220 with a reduced size as an etching mask for the first time. The photoresist layer 220 with the reduced size may expose a portion of the second dielectric layer 202 corresponding to a first step layer 2021. A depth of the first etching process may be equal to the thickness of the second dielectric layer 202 minus a thickness of the first step layer 2021.

Figure 6:
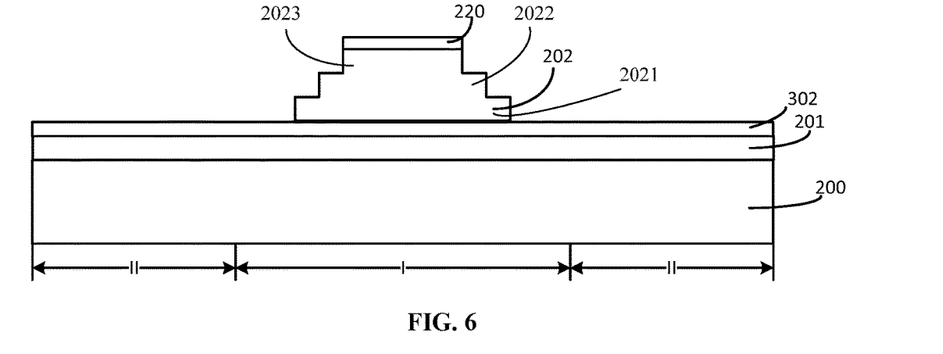

Further, as shown in FIG. 6, after the first etching process, the size of the photoresist layer 220 may be further reduced to expose a portion of the second dielectric layer 202 corresponding to a second step layer 2022. After exposing the portion of the second dielectric layer 202 corresponding to the second step layer 2022, the second dielectric layer 202 may be etched using the further reduced photoresist layer 220 as an etching mask for a second time. An etching depth of the second etching process may be a thickness of a third step layer 2023. After the second etching process, sidewalls of the second dielectric layer 202 may become step sidewalls with a predetermined number of step layers. In one embodiment, a number of the step layers is three. In certain other embodiments, the number of the step layers is greater than three, more etching steps may be needed.

The second dielectric layer 202 (the second dielectric thin film 202a) may be made of any appropriate material, such as silicon oxide, silicon nitride, silicon oxynitride, or silicon carbonitride, etc. The second dielectric layer 202 may be made of a material different from the first dielectric layer 201, which may cause the etching process for forming the step layers of the second dielectric layer 202 to stop at the surface of the first dielectric layer 201. That is, the first dielectric layer 201 may be used as an etching stop layer.

Various processes may be used to form the second dielectric thin film 202a, such as a CVD process, a PVD process, an ALD process or an FCVD process, etc.

Various processes may be used as the first etching process and the second etching process, such as a dry etching process, a wet etching process, or an ion beam etching process, etc. In one embodiment, the first etching process and the second etching process are both an anisotropic dry etching process.

Figure 8:
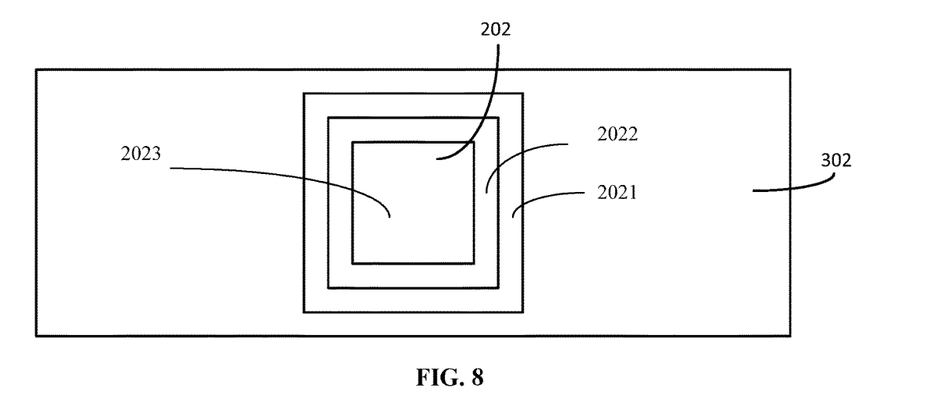

As shown in FIG. 8, after a predetermined number of step layers is obtained, the photoresist layer 220 may be removed from the second dielectric layer 220 having the step surface profile (may also refer as multiple step shape). The photoresist layer 220 may be removed by any appropriate process, such as a wet chemical method, or a plasma ashing process, etc. In one embodiment, the photoresist layer 220 is removed by a plasma ashing process.

Figure 7:
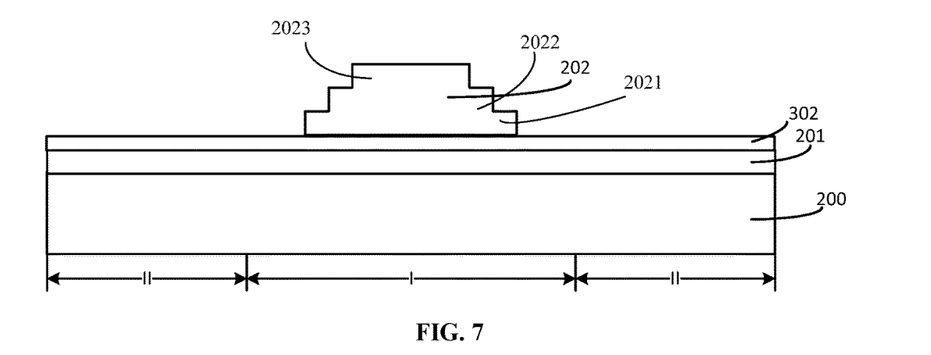

FIG. 7 and FIG. 8 illustrate a cross-section view and a top view of the second dielectric layer 202 formed on the first dielectric layer 201, respectively. As shown in FIGS. 7-8, the second dielectric layer 202 is formed in the device region I; and the second dielectric layer 202 may include a plurality of stacked step layers. The second dielectric layer 202 may have a first surface (not labeled) and second surface (not labeled). The first surface may refer to a surface of the second dielectric layer 202 connecting with the first dielectric layer 201; and the second surface may refer to the top most surface. Thus, from the first surface to the second surface, size of the step layers parallel to the surface of the substrate 200 may consistently shrink, and sidewalls of the second dielectric layer 202 may be a step surface profile.

The second dielectric layer 202 may consists of a plurality of step layers. A number of the step layers may be greater than two. In one embodiment, the number of the step layers is three. A projection of the plurality of step layers of the second dielectric layer 202 on the surface of the substrate 200 may be concentric circles, concentric rectangles, or concentric polygons. In one embodiment, as shown in FIG. 8, the projection of the step layers of the second dielectric layer 202 on the surface of the substrate 200 are concentric rectangles.

In one embodiment, referring to FIG. 7 and FIG. 8, the second dielectric layer 202 includes a first step layer 2021 on the surface of the first dielectric layer 201, a second step layer 2022 on a surface of the first step layer 2021 and a third step layer 2023 on a surface of the second step layer 2022. Further, the second step layer 2022 exposes a portion (step region) the first step layer 2021; and the third step layer 2023 exposes a portion (step region) of the second step layer 2022.

The sidewalls of the second dielectric layer 202 may have a step surface profile (may be referred as multiple step shape), thus a subsequently formed first electrode layer, a subsequently formed second electrode layer and a chamber between the first electrode layer and the second electrode layer may all have step surface profiles. Therefore, an overlap area of the first electrode layer and the second electrode layer formed on the device region I may be greater than an area of the device region I, and the capacitance of a capacitive structure formed by the first electrode layer, the second electrode layer and the chamber may be increased. When the second electrode layer senses a pressure, a capacitance change of the capacitive structure may be correspondingly increased, thus the sensibility of a pressure sensor formed by such a capacitive structure may be increased.

Figure 9:
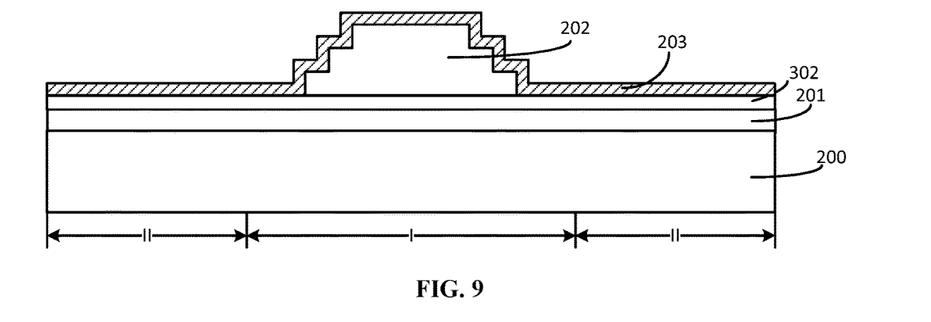

Returning to FIG. 15, after forming the second dielectric layer 202 having a step surface profile, a first electrode layer may be formed on the first dielectric layer 201 and the second dielectric layer 202 (S103). FIG. 9 illustrates a corresponding semiconductor structure.

As shown in FIG. 9, a first electrode layer 203 (may also be referred as a bottom electrode) is formed on the first dielectric layer 201 and the second dielectric layer 202. The first electrode layer 203 may have a step region which is in the device region I and a none-step region which is in the peripheral region II. The step region of the first electrode layer 203 may be on the second dielectric layer 202. The step region of the first electrode layer 203 may have a step surface profile following the step surface profile of the second dielectric layer 202.

The first electrode layer 203 may be made of any appropriate material, such as one or more of TiN, Ti, TaN, Ta, W, TiC, and La, etc. A thickness of the first electrode layer 203 may be in a range of approximately 100 Å~5000 Å. Various processes may be used to form the first electrode layer 203, such as a PVD process, a CVD process, an ALD process or an electroplating process including a direct electroplating process or a chemical electroplating process, etc. In one embodiment, the first electrode layer 203 is formed by a CVD process. The thickness of the first electrode layer 203 may be uniform, the the first electrode layer 203 may comply with the step sidewalls of the second dielectric layer 202.

In one embodiment, as shown in FIG. 14B, conductive vias 306 connecting with the semiconductor devices 304 in the semiconductor substrate 200 may be formed in the first dielectric layer 201; and the first electrode layer 203 may be formed on the conductive vias 306, thus the first electrode layer 203 may electrically connect with the semiconductor devices 304 and/or interconnection structures in the semiconductor substrate 200.

Referring to FIG. 9, the first electrode layer 203 may be formed on a surface of the first dielectric layer 201 in the peripheral region II and the device region I. After subsequently forming a second electrode layer, in order to isolate the first electrode layer 203 from the second electrode layer in the peripheral region II, an insulating layer may need to be formed on a surface of the first electrode layer 203 before subsequently forming a sacrificial layer. The insulation layer may be made of a material different from the sacrificial layer, thus the insulation layer may be kept after subsequently removing the sacrificial layer with certain processes.

Figure 10:
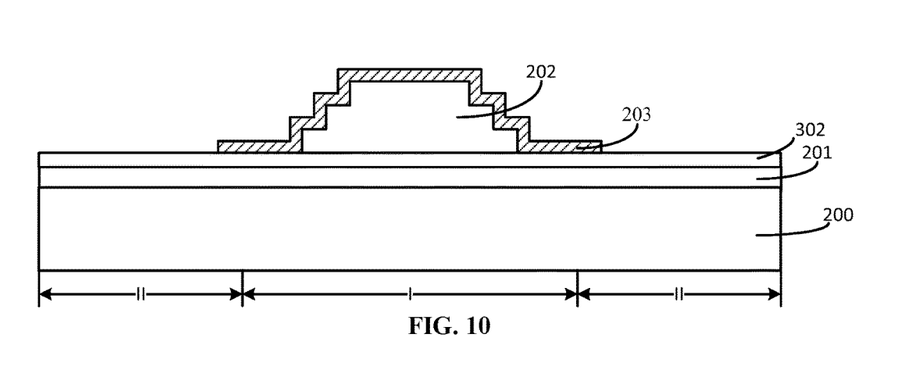

In certain other embodiments, as shown in FIG. 10, the first electrode layer 203 may expose the surface of the first dielectric layer 201 in the peripheral region II. Herein, the first electrode layer 203 may be formed by depositing a first electrode thin film on the first dielectric layer 201, followed by etching the first electrode thin film until the surface of the first dielectric layer 201 in the peripheral region II is exposed, thus the first electrode layer 203 is formed. The first dielectric layer 201 may be used as an etching stop layer for forming the first electrode layer 201, and protect the surface of the substrate 200.

The first electrode layer 203 may expose the surface of the first dielectric layer 201 in the peripheral region II; and a second electrode layer may subsequently be formed on the surface of the first dielectric layer 201 in the peripheral region II. The second electrode layer in the peripheral region II may support the second electrode layer in the device region I to be suspended over the first electrode layer 203 in the device region I, thus a chamber may be formed by the second electrode layer in device region I and the first electrode layer 203. Therefore, a size of a capacitive structure formed by the second electrode layer in the device region I, the first electrode layer 203 in the device region I and the chamber may be easily controlled, and may increase the stability of the pressure sensor.

Figure 11:
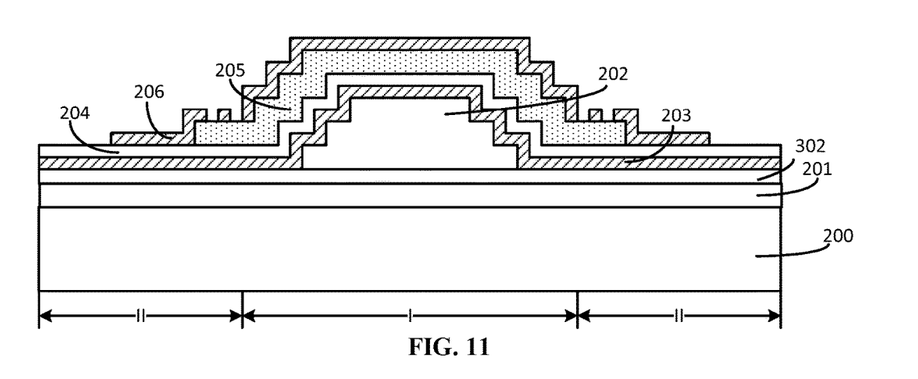

Returning to FIG. 15, after forming the first electrode layer 203, an insulation layer may be formed on the first electrode layer 203; a sacrificial layer may be formed on the insulation layer; and a second electrode layer may be formed on the sacrificial layer (S104). FIG. 11 illustrates a corresponding semiconductor structure.

As shown in FIG. 11, an insulation layer 204 (may be referred as a second insulator) is formed on the first electrode layer 203; a sacrificial layer 205 is formed on the insulation layer 204; and a second electrode layer 206 (may be referred as a top electrode) is formed on the sacrificial layer 205. A surface of the sacrificial layer 205 may be corresponding to the surface of the first electrode layer 203. That is, the surface of the sacrificial layer 205 in the device region I may have a step surface profile. A surface of the second electrode layer 206 may correspond to the surface of the sacrificial layer 205. That is, the surface of the second electrode layer 206 in the device region I may have a step surface profile as well. Further, the second electrode layer 206 may expose a portion of the first insulation layer 204 and a portion of the sacrificial layer 205.

The insulation layer 204 may be made of any appropriate material, such as silicon oxide, silicon nitride, or silicon oxynitride, etc. The insulation layer 204 may be made of a material different from the sacrificial layer 205, after subsequently removing the sacrificial layer 205, the insulation layer 204 may be kept, so that the insulation layer 204 may electrically isolate the second electrode layer 206 from the first electrode layer 203.

Various processes may be used to form the insulation layer 204, such as a PVD process, a CVD process, an ALD process or an FCVD process, etc. In one embodiment, the insulation layer 204 is formed by a CVD process.

The sacrificial layer 205 may be used to define structure and position of a subsequently formed chamber. A process for forming the sacrificial layer 205 may include forming a sacrificial thin film on the surface of the insulation layer 204, followed by etching the sacrificial thin film in the peripheral region II to expose the insulation layer 204.

The sacrificial layer 205 may be made of any appropriate material, such as carbon-based polymer, poly silicon, amorphous carbon, amorphous silicon or phosphor-silicate-glass (PSG), etc. In one embodiment, the sacrificial layer 205 is made of poly silicon.

Various processes may be used to form the sacrificial thin film, such as a CVD process, a PVD process, an ALD process or an epitaxial growth process, etc. In one embodiment, the sacrificial thin film is formed by a selective epitaxial growth process. The sacrificial film formed by the selective epitaxial growth process may have a significantly uniform thickness, thus a surface profile of the sacrificial thin film may cohere with the surface profile of the first electrode layer 203. That is, the surface of the sacrificial layer 205 may also have a step surface profile. After subsequently removing the sacrificial layer 205 and forming the chamber, an inner surface of the second electrode layer 206 in the chamber may cohere with the surface of the first electrode layer 203, thus an overlap area of the first electrode layer 203 in the device region I and the second electrode layer 206 may be increased; and the sensibility of the pressure sensor may be increased.

A temperature of the selective epitaxial growth process may be in a range of approximately 500° C.~800° C. A pressure of the selective epitaxial growth process may be in a range of approximately 1 Torr~100 Torr. A source gas of the selective epitaxial growth process may include a silicon source gas ($SiH_4$ or $SiH_2Cl_2$), HCl and $H_2$, etc. A flow of the silicon source gas may be in a range of approximately 1 sccm~1000 sccm. A flow of HCl may be in a range of approximately 1 sccm~1000 sccm. A flow of $H_2$ may be in a range of approximately 0.1 sccm~50 sccm. A thickness of the sacrificial layer 205 may be in a range of approximately 200 Å~3000 Å.

Various processes may be used to etch the sacrificial thin film, such as a dry etching process, a wet etching process, or an ion beam etching process, etc. In one embodiment, an anisotropic dry etching process is used to etch the sacrificial thin film to form the sacrificial layer 205.

Referring to FIG. 11, the second electrode layer 206 may be formed on the surface of the insulation layer 204 in the peripheral region II and sidewalls and a top surface of the sacrificial layer 205. After subsequently removing the sacrificially layer 205, the second electrode layer 206 in the peripheral region II and the first electrode layer 203 may be isolated by the insulation layer 204.

A process for forming the second electrode layer 206 may include forming a second electrode thin film on the surface of the insulation layer 204 in the peripheral region II and the sidewalls and top surface of the sacrificial layer 205, followed by etching the second electrode thin film until the surface of the insulation layer 204 is exposed. Thus, the second electrode layer 206 is formed.

Further, through holes (not labeled) exposing the surface of the sacrificial layer 205 may also be formed in the second electrode layer 206. The through holes may be used for subsequently removing the sacrificial layer 205. In one embodiment, the through holes may be formed in the second electrode layer 206 in the peripheral region II. In certain other embodiments, the through holes may also be formed in the second electrode layer 207 in the device region I. The through holes may be formed by a same process for etching the second electrode thin film. The through holes may also be formed independently.

The second electrode layer 206 may be made of any appropriate material, such as one or more of TiN, Ti, TaN, Ta, W, TiN, TaC and La, etc. Various processes may be used to form the second electrode layer 206, such as a CVD process, a PVD process, an ALD process, an FCVD process or an electroplating process, etc. A thickness of the second electrode layer 206 may be uniform, thus it may have stable electrical properties. Because the second electrode layer 206 may be one electrode of a subsequently formed capacitive structure, the performance of the capacitive structure may be stable as well.

Further, referring to FIG. 11, a portion of the surface of the insulation layer 204 in the peripheral region II may be exposed by the second electrode layer 206 after a portion of the second electrode layer 206 is removed. A third dielectric layer may subsequently be formed on the second electrode layer 206; and conductive vias may subsequently formed in the third dielectric layer to connect with the first electrode layer 203 and the second electrode layer 206, respectively. Because the portion of the second electrode layer 206 may be removed, when the conductive vias are formed, the conductive vias connecting with the first electrode layer 203 may not be blocked by the second electrode layer 206; and it may be easy to form the conductive vias.

Figure 12:
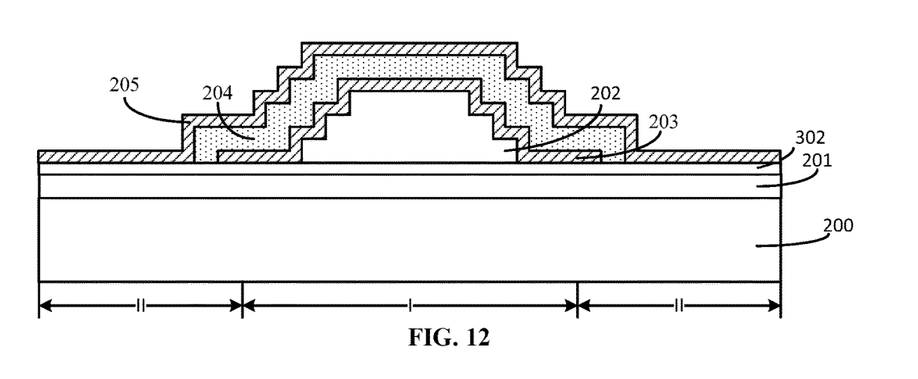

In certain other embodiments, referring to FIG. 10, if the first electrode layer 203 is formed only in the device region I, the sacrificial layer 205 may directly formed on the first electrode layer 202. FIG. 12 illustrates a corresponding semiconductor structure.

As shown in FIG. 12, the sacrificial layer 205 is formed on the surface of the first dielectric layer 201 and sidewalls and a top surface of the first electrode layer 203. Further, the second electrode 206 may be formed on the surface of the first dielectric layer 201 and the sidewalls and the top surface of the sacrificial layer 205. Through holes (not shown) exposing the surface of the sacrificial layer 205 may also be formed in the second electrode layer 206.

After forming the second electrode layer 206, the sacrificial layer 205 may be completely removed, and a chamber may be formed between the first electrode layer 203 and the second electrode layer 206. Further, the second electrode layer 206 on the surface of the first dielectric layer 201 in the peripheral region II may be able to support the second electrode layer 206 to be suspended over the second electrode layer 206. Because the second electrode layer 206 and the first electrode layer 303 may be completely isolated by the chamber, it may unnecessarily form an insulation layer. Therefore, a fabrication process may be simplified; and it may also aid to reduce a device size.

In certain other embodiments, the first electrode layer 203 may be formed on the surface of the first dielectric layer 201 in the device region I and the peripheral region II; the sacrificial layer 205 may be formed on the surface of the first electrode layer 203 in the device region I and the peripheral region II; and the second electrode layer 206 may be formed on the surface of the sacrificial layer region 205. An anisotropic etching process may be subsequently used to remove a portion of the sacrificial layer 205 in the device region I; and a portion of the sacrificial layer 205 in the peripheral region II may be kept. The portion of the sacrificial layer 205 in the peripheral region II may support the second electrode layer 206 to be suspended over the first electrode layer 203; and a chamber may be formed between the first electrode layer 203 and the second electrode layer 206. The chamber may isolate the first electrode layer 203 from the second electrode 206. The sacrificial layer 205 may be made of an insulating material including carbon-based polymer, amorphous carbon, or low dielectric constant material, etc.

Returning to FIG. 15, after forming the second electrode layer 206, the sacrificial layer 205 may be removed; and a chamber may be formed (S105). FIG. 13 illustrates a corresponding semiconductor structure.

As shown in FIG. 13, a chamber 207 is formed between the first electrode layer 203 and the second electrode layer 206 by removing the sacrificial layer 205 in the device region I. A surface profile of the second electrode layer 206 in the chamber 207 may correspond to the surface profile of the first electrode layer 203. That is, the surface of the second electrode layer 206 corresponding to the first electrode layer 203 in the device region I may have a step surface profile.

Various processes may be used to remove the sacrificial layer 205, such as a dry etching process, or a wet etching process, etc. The dry etching process and the wet etching process may be anisotropic etching processes. The anisotropic dry etching process may not be limited by etching directions, and may start etching the sacrificial layer 205 from the portion exposed by the through holes.

In one embodiment, if the sacrificial layer 205 is made of poly silicon, an anisotropic dry etching process is used to remove the sacrificial layer 205. An etching gas may be one or more of $SF_6$, HBr, HCl, $C_2F_6$, and $CF_4$, etc. A power of the anisotropic dry etching process may be in a range of approximately 100 W~500 W; and a bias voltage may be in a range of approximately 0V~100V. A temperature of the anisotropic dry etching process may be in a range of approximately 40° C.~60° C.

In one embodiment, the sacrificial layer 205 may be completely removed. In certain other embodiments, a portion of the sacrificial layer 205 may be kept.

Because the insulation layer 204 may be made of a material different from the sacrificial layer 205, after removing the sacrificial layer 205, the insulation layer 204 may be exposed; and the first electrode layer 203 in the peripheral region II and the second electrode layer 206 may be isolated by the insulation layer 204. A portion of the second electrode layer 206 on the surface of the insulation layer 204 in the peripheral region II may be able to support a portion of the second electrode layer 206 in the device region I to be suspended over the surface of the first electrode layer 203, thus the second electrode layer 206 may be structurally stable.

After forming the chamber 207, the first electrode layer 203, the second electrode layer 206 and the chamber 207 may form a capacitive structure. The second electrode layer 206 may be deformed by an external pressure. Such a deformation may cause a distance between the first electrode layer 203 and the second electrode layer 206 to be decreased, and a capacitance of the capacitive structure may be changed. A capacitance change of the capacitive structure may be related to a value of the pressure, thus a pressure sensor using the capacitive structure may be able to obtain external pressure information.

Because the thickness of the sacrificial layer 205 may be uniform, the surface profile of the first electrode layer 203 in the chamber 207 may be identical to the surface profile of the second electrode layer 206, which may cause the surface of the second electrode layer 206 corresponding to the first electrode layer 203 in the device region to have a step surface profile as well. Therefore, an overlap area of the second electrode layer 206 in the device region I and the first electrode 203 may be greater than an area of the device region I, such a greater overlap area may cause the capacitance of the capacitive structure to be increased. Further, the second electrode 206 having the step surface profile may be relatively flexible, thus it may be cable to sense a substantially small pressure. Therefore, the sensibility of the pressure sensor may be significantly improved.

Returning to FIG. 15, after removing the sacrificial layer 305 to form the chamber 307, a third dielectric layer with an opening exposing a portion of the second electrode layer 206 may be formed on the second electrode layer 206 (S106). FIGS. 14A-14C illustrate a corresponding semiconductor structure.

As shown in FIG. 14A, a third dielectric layer 208 with an opening 209 is formed on the second electrode layer 206 and the insulation layer 204. The opening 209 exposes a portion of the second electrode layer 206 in the device region I.

The third dielectric layer 208 and the opening 209 may be formed by forming the third dielectric layer 208 on the second electrode layer 206 and the first dielectric layer 201, followed by etching the third dielectric layer 208 in the device region I until the surface of the second electrode layer 206 is exposed; and the opening 209 is formed.

The second electrode layer 206 may have through holes (not labeled), the third dielectric layer 208 may be used to seal the through holes, and the chamber 207 may be completely closed to form the capacitive structure. Further, the third dielectric layer 208 may protect the second electrode layer 206 in the peripheral region II. The opening 209 in the third dielectric layer 208 may expose a surface of the second electrode layer 206 in the device region I, thus the second dielectric layer 206 in the device region I may sense pressure and deform.

The third dielectric layer 208 may be made of any appropriate material, such as silicon oxide, silicon nitride, silicon oxynitride, silicon carbonitride or low-K dielectric material, etc. A thickness of the third dielectric layer 208 may be in a range of approximately 4000 Å~5 µm.

Various processes may be used to form the third dielectric layer 208, such as a CVD process, a PVD process, an ALD process or an FCVD process, etc. In one embodiment, the third dielectric layer 208 is formed by a CVD process. The CVD process may include a high-density plasma CVD (HDP CVD) process, or a plasma enhanced CVD (PECVD) process, etc. A material formed by the PECVD process or the HDP CVD process may be deposited on sidewalls of the through holes, and the through holes may be closed, thus the chamber 207 may be airtight. Further, the material formed by the PECVD process or the HDP CVD process may be unable to overfill the chamber 207, thus the chamber 207 may have a desired quality.

In one embodiment, the third dielectric layer 208 is made of silicon dioxide; and the third dielectric layer 208 is formed by a PECVD process. A pressure of the PECVD process may be in a range of approximately 1 Torr~10 Torr. A temperature of the PECVD process may be in a range of approximately 360° C.~420° C. A power of the plasma of the PECVD process may be in a range of approximately 400 W~2000 W. A flow of oxygen may be in a range of approximately 500 sccm~4000 sccm. A source of ethyl silicate may be in a range of approximately 500 sccm~5000 sccm. A flow of helium may be in a range of approximately 1000 sccm~5000 sccm.

In certain other embodiments, a fourth dielectric layer (not shown) may be formed on the second electrode layer 206; and the third dielectric layer 208 may be formed on the fourth dielectric layer. The fourth dielectric layer may be made of a material different from the third dielectric material layer 208. The fourth dielectric layer may be used to protect the second electrode layer 206 when the third dielectric layer 208 in the device region I is etched to form the opening 209. The fourth dielectric layer may be formed by a PECVD process or a HDP CVD process, etc. The fourth dielectric layer may seal the through holes in the second electrode layer 206. Further, the forth dielectric layer may prevent the through holes to be reopen when the third dielectric layer 208 in the device region I is etched.

After forming the third dielectric layer 208, as shown in FIG. 14C, a second conductive via 310 connecting with the second electrode layer 206 may be formed in the third dielectric layer 208 in the peripheral region II. Further, if the first electrode layer 203 is not connected with the semiconductor devices in the substrate 200, a first conductive via 308 connecting with the first electrode layer 203 may also be formed in the third dielectric layer 208 in the peripheral region II. Electrical interconnection structures may be subsequently formed to electrically connect the second conductive via and/or the first conductive via with the semiconductor devices in the substrate 200 to form a MEMS capacitive pressure sensor.

Thus, a MEMS capacitive pressure sensor may be formed by the above disclosed processes and methods, the corresponding MEMS capacitive pressure sensor is illustrated in FIG. 14A. The MEMS capacitive pressure sensor includes a substrate 200 having a device region I and a peripheral region II. The MEMS capacitive pressure sensor also includes a first dielectric layer 201 on the substrate 200, and a second dielectric layer 202 having a step surface profile on the first dielectric layer 201 in the device region I. Further, the MEMS capacitive pressure sensor includes a first electrode layer 203 having a step surface profile on the second dielectric layer 202, and an insulation layer 204 having a step surface profile on the first electrode layer 203. Further, the MEMS capacitive pressure sensor also include a second electrode layer 206 having a step surface profile with a portion on the second dielectric layer 202 in the peripheral region II and the rest suspended over the first electrode layer 203 in the device region I, and a chamber 207 between the first electrode layer 203 and the second electrode layer 206 in the device region I. Further, the MEMS capacitive pressure sensor also includes a third dielectric layer 208 on the second electrode layer 206, and an opening 209 exposing the surface of the second electrode layer 206 in the third dielectric layer 106 in the device region I. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A MEMS capacitive pressure sensor, comprising:
    a substrate having a first region and a second region surrounding the device region;
    a first dielectric layer formed on the substrate;
    a second dielectric layer having a step surface profile formed on the first dielectric layer;

a first electrode layer having a step surface profile formed on the second dielectric layer and the first dielectric layer;

an insulation layer formed on the first electrode layer; a second electrode layer having a step surface profile with a portion formed on the insulation layer in the peripheral region and the rest suspended over the first electrode layer in the device region; and a chamber having a step surface profile formed between the first electrode layer and the second electrode layer, wherein a projection of the step surface profile of the second dielectric layer on the substrate is a plurality of concentric circles, a plurality of concentric squares or a plurality of concentric polygons.

2. The MEMS capacitive pressure sensor according to claim 1, wherein the second dielectric layer having a step surface profile is formed by:

forming a second dielectric thin film on the first dielectric layer;

forming a patterned photoresist layer on the second dielectric thin film;

etching the second dielectric thin film to form a second dielectric layer;

etching the second dielectric layer with a reduced patterned photoresist layer as an etching mask to form a second dielectric layer having a first step layer with a predetermined depth;

etching the second dielectric layer having the first step layer to form a second dielectric layer having the first step layer and a second step layer using a further reduced patterned photoresist layer as an etching mask; and repeating the etching process with further a reduced patterned photoresist layer as an etching mask until the second dielectric layer having the step surface profile has a predetermined number of step layers.

3. The MEMS capacitive pressure sensor according to claim 1, wherein the substrate further includes:

a plurality of semiconductor devices and electrical interconnection structures inside, or on one surface.

4. The MEMS capacitive pressure sensor according to claim 3, wherein the first dielectric layer further includes:

a plurality of conductive vias or trench structures connecting the first electrode layer with the substrate, or the semiconductor devices in the substrate.

5. The MEMS capacitive pressure sensor according to claim 1, further including:

a third dielectric layer on the second electrode layer; and an opening in the third dielectric layer exposing a portion of the second electrode layer in the device region.

6. The MEMS capacitive pressure sensor according to claim 5, wherein the third dielectric layer further includes:

a first conductive via connecting with the first electrode layer; and a second conductive via connecting with the second electrode layer.

7. The MEMS capacitive pressure sensor according to claim 1, wherein:

the first region is a device region; and the second region is peripheral region.

8. The MEMS capacitive pressure sensor according to claim 7, wherein:

the first electrode layer is on a surface of the first dielectric layer in the device region and the peripheral region;

a portion of the second electrode layer is on a surface of the insulation layer in the peripheral region; and the rest of the second electrode layer is suspended over the first electrode layer in the device region.

9. The MEMS capacitive pressure sensor according to claim 1, further including:

an etching stop layer on the first dielectric layer; and a fourth dielectric layer on the second electrode layer.

10. The MEMS capacitive pressure sensor according to claim 1, wherein:

the first dielectric layer is made of SiN or SiCN;

the first electrode layer and the second electrode layer are made of one or more of TiN, Ti, TaN, Ta, W, TiC, TaC and La; and the second dielectric layer is made of $SiO_2$, SiN, SiON, SiCN or low dielectric constant material.

11. The MEMS capacitive pressure sensor according to claim 1, wherein the chamber is formed between the insulation layer and the second electrode layer.

12. The MEMS capacitive pressure sensor according to claim 1, wherein the second dielectric layer is fully covered by the first electrode layer.

* * * * *